United States Patent
Amaru et al.

(10) Patent No.: US 11,669,665 B1
(45) Date of Patent: Jun. 6, 2023

(54) APPLICATION-SPECIFIC INTEGRATED CIRCUIT (ASIC) SYNTHESIS BASED ON LOOKUP TABLE (LUT) MAPPING AND OPTIMIZATION

(71) Applicant: Synopsys, Inc., Mountain View, CA (US)

(72) Inventors: Luca Gaetano Amaru, Santa Clara, CA (US); Vinicius Neves Possani, Sunnyvale, CA (US); Eleonora Testa, Vaud (CH); Felipe dos Santos Marranghello, Sunnyvale, CA (US); Christopher Casares, Sunnyvale, CA (US); Jiong Luo, Mountain View, CA (US); Patrick Vuillod, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 10 days.

(21) Appl. No.: 17/527,911

(22) Filed: Nov. 16, 2021

Related U.S. Application Data

(60) Provisional application No. 63/114,245, filed on Nov. 16, 2020.

(51) Int. Cl.
*G06F 30/327* (2020.01)
*G06F 30/343* (2020.01)
(Continued)

(52) U.S. Cl.
CPC .......... *G06F 30/327* (2020.01); *G06F 30/343* (2020.01); *H03K 19/1731* (2013.01);
(Continued)

(58) Field of Classification Search
CPC .... G06F 30/327; G06F 30/343; G06F 30/323; G06F 30/337; G06F 30/34; G06F 30/373;
(Continued)

(56) References Cited

U.S. PATENT DOCUMENTS

| | | | | |
|---|---|---|---|---|
| 5,521,835 A | * | 5/1996 | Trimberger | G06F 30/34 716/117 |
| 5,537,341 A | * | 7/1996 | Rose | G06F 30/34 716/132 |

(Continued)

FOREIGN PATENT DOCUMENTS

| | | | | |
|---|---|---|---|---|
| GB | 2310064 A | * | 8/1997 | G06F 17/5054 |

OTHER PUBLICATIONS

Kapoor, "An Efficient Graph-Based Technology Mappying Algorithm for FPGAs Using Lookup Tables", http://www.cecs.uci.edu/~papers/compendium94-03/papers/1994/fpga94/pdffiles/fpga94_3_p1.pdf, 1994, 8 pages. (Year: 1994).*

*Primary Examiner* — Phallaka Kik
(74) *Attorney, Agent, or Firm* — Fenwick & West LLP

(57) ABSTRACT

A logic network for an integrated circuit is synthesized as follows. The logic network is mapped to a network of lookup tables (LUTs). The LUT mapping is based at least in part on estimated areas of the LUTs. The individual LUTs in the network are improved (LUT optimization), for example using various Boolean optimization techniques. The network of improved LUTs is then reduced to a gate-level netlist of standard cells.

20 Claims, 6 Drawing Sheets

(51) Int. Cl.
*G06F 30/323* (2020.01)
*G06F 30/337* (2020.01)
*G06F 30/34* (2020.01)
*G06F 30/373* (2020.01)
*G06F 30/398* (2020.01)
*H03K 19/17* (2006.01)
*H03K 19/173* (2006.01)
*H03K 19/17728* (2020.01)

(52) U.S. Cl.
CPC ..... *H03K 19/17728* (2013.01); *G06F 30/323* (2020.01); *G06F 30/337* (2020.01); *G06F 30/34* (2020.01); *G06F 30/373* (2020.01); *G06F 30/398* (2020.01)

(58) Field of Classification Search
CPC .............. G06F 30/398; H03K 19/1731; H03K 19/17728
USPC ............................ 716/104, 116, 135; 703/15
See application file for complete search history.

(56) References Cited

U.S. PATENT DOCUMENTS

| | | | | |
|---|---|---|---|---|
| 5,610,829 | A * | 3/1997 | Trimberger | G06F 30/34 716/117 |
| 5,633,805 | A * | 5/1997 | Simonsen | G06F 30/327 716/108 |
| 7,523,151 | B1 * | 4/2009 | Mellott | H03M 7/18 708/491 |
| 9,696,991 | B1 * | 7/2017 | Langhammer | G06F 7/48 |
| 10,162,918 | B1 * | 12/2018 | Iyer | G06F 30/30 |
| 10,168,990 | B1 * | 1/2019 | Annamalai | G06F 1/03 |
| 10,740,517 | B1 * | 8/2020 | Amaru | G06F 30/337 |
| 2003/0229481 | A1 * | 12/2003 | Wu | G06F 30/367 703/14 |
| 2004/0124877 | A1 * | 7/2004 | Parkes | H03K 19/17784 326/41 |

\* cited by examiner

APPLICATION-SPECIFIC INTEGRATED CIRCUIT (ASIC) SYNTHESIS BASED ON LOOKUP TABLE (LUT) MAPPING AND OPTIMIZATION

RELATED APPLICATION

This application claims priority under 35 U.S.C. § 119(e) to U.S. Provisional Patent Application Ser. No. 63/114,245, "ASIC Synthesis Based on Lookup Table (LUT) Optimization," filed Nov. 16, 2020. The subject matter of all of the foregoing is incorporated herein by reference in its entirety.

TECHNICAL FIELD

The present disclosure relates to synthesis of application-specific integrated circuits (ASICs) using lookup table (LUT) optimization.

BACKGROUND

During ASIC synthesis, a logical description of an integrated circuit (such as hardware description language (HDL) code) is transformed into a netlist of standard cells and gates. In some embodiments, the netlist may be a graph structure where nodes of the graph structure represent components of a circuit and edges of the graph structure represent interconnections between the components. Both the HDL code and the netlist can be used by an electronic design automation (EDA) product to verify that the integrated circuit, when manufactured, performs according to the specified design. The netlist can be optimized for a target semiconductor manufacturing technology. A common goal of ASIC synthesis is to reduce the area occupied by the components in the netlist.

SUMMARY

In some aspects, a logic network for an integrated circuit is synthesized as follows. The logic network is mapped to a network of lookup tables (LUTs). The LUT mapping is based at least in part on estimated areas of the LUTs. The individual LUTs in the network are improved (LUT optimization), for example using various Boolean optimization techniques. The network of improved LUTs is then reduced to a gate-level netlist of standard cells.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to ASIC synthesis based on lookup table (LUT) optimization. In a typical ASIC synthesis operation, an HDL design of a logic network is transformed into a gate-level netlist of standard cells. In the present disclosure, ASIC synthesis is achieved by transforming the logic network into a network of interconnected lookup tables (LUTs), optimizing the network of LUTs and then reducing the LUTs into the gate-level netlist of standard cells.

Implementing a logic network with a network of interconnected LUTs is a common approach used to configure FPGAs (field programmable gate arrays), because LUTs are often the basic building block for FPGAs. A LUT is circuitry with a given number of inputs, where the circuitry can implement any logic that is a function of the inputs. A k-LUT is a LUT with k inputs. FPGAs are often constructed as a group of configurable and interconnectable LUTs. Therefore, if a logic network can be reduced to a set of interconnected LUTs, it can then be configured on the FPGA. Each LUT on the FPGA is configured to implement the logic required to implement the overall logic network. However, the LUTs on the FPGA are fixed in area because they are already fabricated, so all k-LUTs occupy the same area on the FPGA regardless of what function is configured on the k-LUT.

However, the same approach traditionally has not produced good results for the synthesis of ASICs. In part, this is because standard cells (gates) rather than LUTs are the basic building block for ASICs. Two logic functions that are both expressed as k-LUTs would occupy the same area on an FPGA, but could occupy very different areas on an ASIC because each k-LUT implementation on the ASIC need only implement the specific logic function of interest using standard cells and not the generalized k-LUT capable of implementing any logic function (as is the case in FPGAs). Thus, a netlist that is optimized to be implemented by LUTs may not be optimized to be implemented by standard cells. This can result in larger area and higher power consumption, compared to other synthesis approaches.

Figure 1:
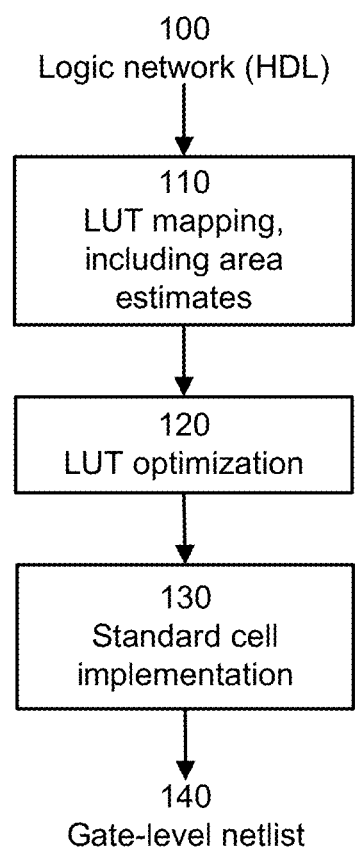
FIG. 1 depicts a flowchart of ASIC synthesis based on LUT optimization.

In the present disclosure, LUT optimizations are altered to be better targeted to ASICs. FIG. 1 depicts a flowchart of ASIC synthesis based on LUT optimization in accordance with some embodiments of the present disclosure. The logic network of interest 100 is mapped 110 to a network of LUTs. FPGAs are typically constructed as a sea of LUTs, and the actual function to be implemented is determined by configuring the FPGA. LUT mapping in FPGAs is based primarily on the number of LUTs used, because the LUTs in an FPGA have already been fabricated so the area of the LUT cannot be altered.

However, this is not the case for ASICs. Different LUTs (i.e., LUTs that implement different logic) may be implemented using different designs and may occupy a different amount of area on the die. Thus, the LUT mapping 110 in FIG. 1 estimates the areas occupied by different LUTs and the LUT mapping takes this into account. After the logic network is mapped 110 to a network of LUTs, the LUTs in the network are optimized 120. Different Boolean optimization techniques may be used to simplify, reduce, or otherwise improve the LUTs, for example to reduce the area occupied. After LUT optimization 120, the resulting network is reduced 130 to standard cells, yielding the gate-level netlist 140.

Look-up table (LUT) synthesis is the process of transforming a description of a logic network to a network of LUTs that implement the logic. LUT synthesis may provide intrinsic complexity reduction in the representation of logic networks. In the following, the optimization power of LUT-mapping and LUT-minimization technologies are applied to standard-cell based Application-Specific Integrated Circuits (ASICs) design, but taking into account the differences between FPGAs and ASICs.

Some intuition behind the LUT optimization flow for ASICs is the following. In this flow, LUT mapping is driven by estimated area rather than LUT count. Area may be estimated based on a count of literals in the logic function to be implemented by the LUT, or a count of nodes (2-input AND gates) in an AIG (And-Inverter Graph) representation of the logic function. AIGs are used to represent and optimize Boolean functions and circuits. They are directed acyclic graphs, where each internal node is a Boolean AND, and edges can be either regular or complemented (complemented edges are inversions). LUT mapping driven by AIG count operates as an eliminate, subject to an upper bound on the fan-in (number of inputs) of the LUTs. This type of logic representation and optimization can find Boolean simplifications which are difficult to find using other techniques. It can also enable stronger and more global Boolean optimizations, which are less likely to get stuck in local minima. This is further enhanced if used in a lossless synthesis fashion, meaning that intermediate mappings are recorded so that past optimizations are not lost and may be retrieved if desirable. As a result, the integration of LUT optimization inside a Boolean resynthesis step may be used to improve the area, power consumption or other Quality of Results (QoR) achievable by logic synthesis.

This disclosure presents a LUT based, Boolean optimization flow, which may be used during a synthesis operation for ASICs. Several notions of LUT mapping are described and Boolean techniques are adapted to utilize the compression of LUTs. The optimized LUT networks can be decomposed into smaller and faster AIGs or mapped networks. Various aspects disclosed below include the following:

Enhanced LUT mapping, considering factored literals or AIG cost of each LUT.

Specialized Boolean methods for simplifying LUT networks, targeting the best AIG or cell-mapped implementation, after decomposition.

Complete ASIC synthesis embedding a LUT optimization flow, including Boolean resynthesis and lossless synthesis techniques.

I. LUT Mapping for ASIC Synthesis

In LUT mapping (e.g., step 110 in FIG. 1), a logic network is covered with (implemented by) a network of k-bounded lookup tables (k-LUTs) where each k-LUT has k inputs and can represent any function of k variables. Several methods and algorithms for LUT mapping may be used. For example, tree mappers partition the initial graph into a forest of trees, map each tree individually and combine the mapping for each tree to find a cover (implementation) for the initial network. Alternate methods may instead collapse the network into nodes with more than k variables and decompose them to obtain a k-LUT mapping. Other approaches find a cover for the network from the set of possible partitions of the network into k-LUTs.

The FlowMap algorithm is a known algorithm for LUT mapping, which obtains a minimum depth k-LUT cover for a network. That is, it produces an implementation using k-LUTs, where the implementation has the minimum number of LUTs from input to output (i.e., depth). In yet another approach, runtime may be improved by using only a subset of the possible partitions of the network into k-LUTs, known as priority cuts.

Other improvements include speed up of cut (partition) computation and area recovery. Several approaches aim at reducing the structural bias of technology mapping, which refers to the dependence of the mapped network on the initial structure. Functionally Reduced AIGs (FRAIGs) use a combination of simulation and combinational equivalence checking (SAT) to find equivalent (up to complement) AND nodes. These AND nodes are merged into choice nodes. Intuitively, a choice node can be seen as a vertex that encodes different implementations of a function (up to complementation).

Alternatively, a lossless synthesis flow generates choices nodes by storing nodes generated in intermediate steps of the synthesis process. In contrast, certain technology mappers only sees the nodes in the network resulting from the optimizations process. In another approach, a framework to combine logic transformations with technology mapping is used. At each step the technology mapper evaluates the impact of a logic transformation on the mapped circuit.

Figure 2:
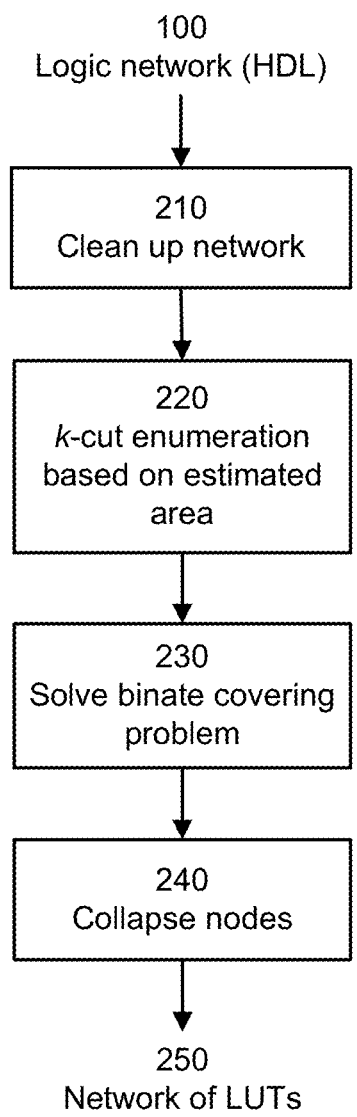
FIG. 2 depicts a flowchart for LUT mapping.

FIG. 2 depicts a flowchart for area-oriented LUT mapping. This LUT mapping operates as a restructuring transform, such as a fan-in-bounded eliminate, reshaping a Boolean network N 100 to a more convenient state 250 for ASIC synthesis. The LUT mapping shown in FIG. 2 is also depicted in the pseudo code below.

---
Algorithm 1 Top-Level LUT Mapping Algorithm
---

Input: Network N, LUT size k, lut_ratio r, backtrack b
Output: k-bounded network N' of LUTs
  1:      network_cleanup(N);
  2:      /* enumerate cutsets and process choices if available */
  3:      C = find_cutsets(N, k);
  4:      /* form the matches considering literal costing */
  5:      M = compute_matches(N, C, r);
  6:      /* form and solve the binate covering problem */
  7:      S = binate_cover(N, M, b);
  8:      /* re-form the network from the solution */
  9:      collapse_network(N, S); return N';

---

The procedure works as follows. Initially, the mapper sweeps the network N (100 in FIG. 2) to clean up 210 the network. Nodes that are single input gates (buffers and inverters) may be collapsed. In addition, propagation of constants may be used to simplify the network. This preprocessing 210 prepares the network for k-cut enumeration 220, which traverses the network recursively from Primary Outputs (POs) to Primary Inputs (PIs) computing the cut set (partitioning into k-LUTs) for each internal node. If a given network can be partitioned in different ways, the mapper can process them during the k-cut enumeration step to increase the mapping opportunities.

Typically, a FPGA LUT-based mapper does not consider the literal/AIG count of the internal logic of a given LUT. However, since this LUT mapper re-shapes the network for ASIC synthesis, the internal LUT area is estimated to distinguish the cost of selecting a smaller or a larger cut during the mapping process. Therefore, this mapper computes possible matches of cuts into LUTs by considering the implicit literal/AIG count of k-cuts into LUTs.

When using small LUTs, e.g., 3-LUTs, a lut_ratio parameter may be used to determine the ratio among the area cost of different cut sizes. The intuition is that 2-LUTs often map often to a single AIG node (unless it represents a XOR) and, therefore, all 2-LUTs may be approximated as having the same area. 3-LUTs have higher complexity but, rather than estimating the area of each 3-LUT based on its function, the area of all 3-LUTs may be estimated as a multiplier times the area of the 2-LUT. Using a lut_ratio of 1.4 for k=3 gives better LUT mappings that translate into smaller ASIC implementations. A lut_ratio of 1.4 for k=3 means that a 3-LUT has 1.4× the area cost of a 2-LUT. When considering LUTs with higher k values, the area of each candidate LUT may be estimated based on its cone of logic. This can be achieved by running a quick cube and kernel extraction (or other technique) on the cone of logic to estimate the factored literal count or AIG count of that logic function.

The next mapping step (line 7 in Algorithm 1 or step 230 in FIG. 2) is to select a subset of all possible k-cuts/matches that cover the network while minimizing the overall area cost. This DAG (directed acyclic graph)-covering is formulated as a binate covering problem solved with a branch-and-bound approach. The binary covering problem is the problem of finding an implementation (cover) of the logic function to be implemented. Branch-and-bound solutions are based on exploring different possible paths to a solution (the branches), where branches are discarded based on estimated bounds as the solution progresses. The binate covering is guided by the associated area cost of each match and the solving process is bounded by a given backtracking limit, which limits the number of branchings that may be backtracked in finding the solution. Branch-and-bound can provide a high quality solution within a given computational effort limit.

Finally, the mapper delivers a k-bounded network N' of LUTs 250 by locally collapsing 240 nodes into their fan-ins up to reach the k-cuts selected in the covering process. This final process of node collapsing 240 is packing the logic into LUTs 250 using the annotations in the binate cover S, previously computed by the k-cut enumeration and the binate covering steps.

Table I presents a comparison between the LUT mapper described herein and shown in FIG. 2, versus a standard FPGA LUT mapper (the ABC command &if -K 3-a) in an area-oriented LUT mapping scenario. Each row is a different circuit that is LUT mapped. The first three columns show results for the standard FPGA LUT mapper and the last three columns show results for the LUT mapper described herein. LUTs is the number of LUTs, literals is the number of AIGs which is also a measure of area, and level is the maximum number of LUTs between the input and output. The mapper disclosed herein demonstrates area improvements over the standard FPGA LUT mapper.

TABLE I

AREA-ORIENTED LUT MAPPING RESULTS COMPARED TO ABC &if.

| benchmark | ABC &if k = 3 | | | Proposed Mapper k = 3 | | |
|---|---|---|---|---|---|---|
| | LUTs | literals | levels | LUTs | literals | levels |
| adder | 256 | 2,292 | 129 | 256 | 2,292 | 129 |
| dec | 298 | 620 | 4 | 304 | 612 | 4 |
| i2c | 745 | 2,342 | 13 | 754 | 2,263 | 13 |
| max | 1,290 | 4,682 | 159 | 1,248 | 4,408 | 190 |
| mem_ctrl | 25,361 | 88,049 | 79 | 23,667 | 78,832 | 95 |
| log2 | 27,816 | 93,777 | 399 | 25,447 | 88,446 | 375 |

II. Boolean Methods for LUT Optimization

Approaches to LUT optimization (e.g., step 120 in FIG. 1) include Boolean methods. Boolean methods are based on Boolean transformations that consider the nature of logic functions and improve logic networks through the freedom provided by don't care conditions. Consider permissible functions as one example of don't care interpretation in synthesis: if the function at node n can be changed into another function without changing the behavior of the primary outputs, the new function is called a permissible function. The set of all permissible functions for a node n is called its Maximum Set of Permissible Functions (MSPF), and can be used to enhance Boolean transformations such as resubstitution, refactoring, rewriting, etc. Due to the use of don't cares and Boolean identities, Boolean methods achieve better optimization. Different reasoning engines can be used for detecting permissible functions and don't care conditions, and the right choice of such engine can improve the scalability of the Boolean methods. Examples of such engines include truth tables, BDDs (Binary Decision Diagrams), and SAT (SATisfiability).

Figure 3:
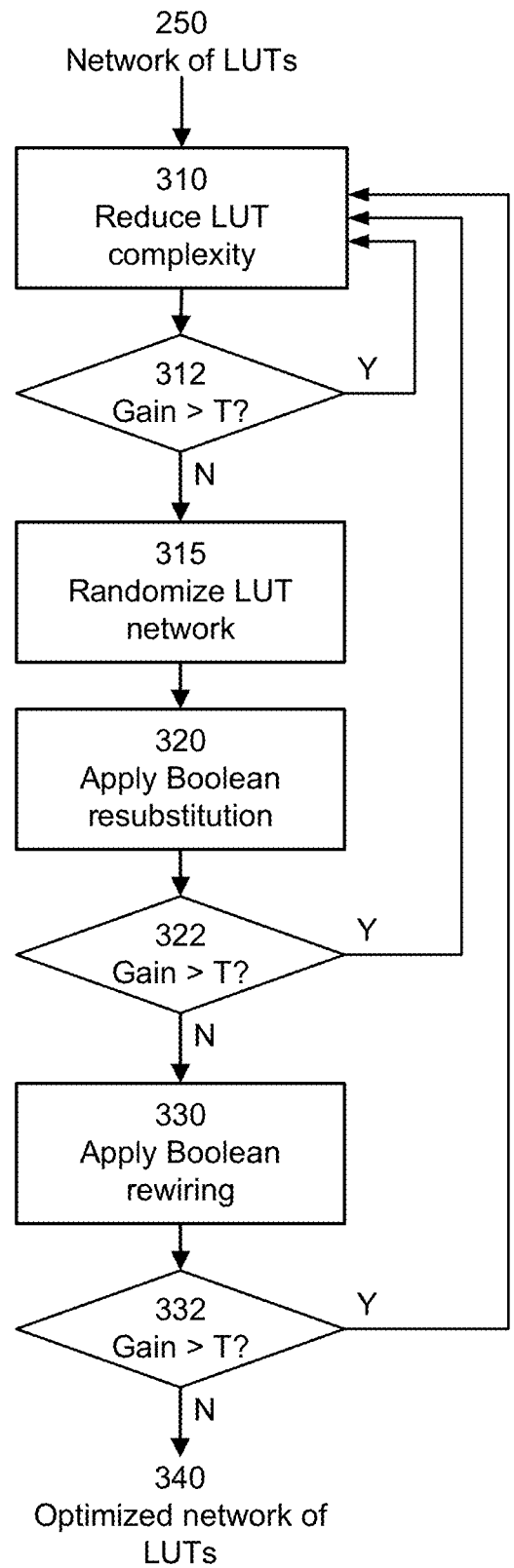
FIG. 3 depicts a flowchart for LUT optimization.

FIG. 3 depicts a flowchart for LUT optimization. This process uses a number of different techniques for improving LUTs, which are applied in order of increasing runtime. Individual techniques are first described below and then the entire flow is described.

A. LUT Complexity Reduction

Reducing the complexity of LUTs in a LUT network is an important step for improving the ASIC implementation cost, shown as 310 in FIG. 3. Reducing the LUT complexity can be interpreted as reducing the NAND2/AIG cost (i.e., estimated area) of the LUT. Techniques to achieve this goal include (1) running Sum Of Products (SOP) minimization on the LUT, including don't cares, and (2) reducing the cardinality/support-size of a LUT.

SOP Simplify with don't cares: Sum Of Products (SOP) is a standard Boolean representation, which expresses a logic function as a sum of products. SOP simplification employs traditional 2-level minimization algorithms applied to the SOP representation. In the context of LUTs, SOP simplification can be made powerful because there is a tight bound on the support size by construction, so higher effort minimizations can be run without incurring in intractable runtime. Exact 2-level minimization methods (i.e., minimization of 2 levels of LUTs connected to each other) can be used with 3, 4, 5 fan-in bounds in practice with quick runtime.

In order to unlock more simplifications, the system may also consider don't cares. More specifically, LUT networks offer the opportunity to add don't cares to SOP simplification in a bounded way. Controllability don't cares (CDC) occur when an output of the LUT is not affected by (cannot be controlled by) the inputs. These can be added by considering one-level fan-in of LUTs. Observability Don't Cares (ODC) occur when changes to the input of a LUT does not result in any change in (cannot be observed at) the output. These can be added by considering one-level fan-out of LUTs, up to a maximum fan-out value F. The CDC complexity is proportional to $k^2$, where k is the LUT size. The ODC complexity is proportional to F k.

Other enhancements to SOP simplification for LUTs regards the acceptance criterion. Rather than accepting based on literal count decrease, the acceptance criterion may be improved to consider factored literals, by running quick extraction on the simplified SOP. This cost function has better correlation to a final ASIC implementation. Both phases can be tried during LUT SOP simplification with don't cares, and accept the best polarity (regular or complemented) leading to the smallest factored literals cost, including the output inverter if necessary.

Support reduction: When considering a final ASIC implementation, it is desirable to reduce the support size of each LUT. For example, it is desirable to reduce a 3-LUT into a 2-LUT, if possible, before decomposing and mapping onto standard cells. Indeed, LUTs could have redundant inputs when considering the global network functionality. The support of LUTs may be reduced by computing the functional support using either BDD or SAT based methods. The functional support can be computed with respect to a frontier, i.e., a set of internal variables in the network, or with respect to the primary inputs of the network. When the functional support size is smaller than the LUT size of the node, the old SOP is replaced with a new ISOP computed based on the functional support. Either BDD or SAT based methods can be used to compute ISOPs efficiently in this context. SAT based methods are preferable when the frontier employed for computation is deep, e.g., going to the primary inputs.

B. LUT-Enhanced Boolean Resubstitution

Boolean resubstitution (320 in FIG. 3) can be effective when run on a LUT network. Resubstituting and saving one large LUT, or replacing a k-LUT with a (k–j)-LUT, reduces the complexity of the network more significantly than just resubstituting one AIG node. Compressing the network into LUTs increases the visibility of Boolean resubstitution so higher order opportunities can be found. For LUT-optimization for ASICs purposes, Boolean resubstitution may be cost-accurate and capable of the strongest resubstitution possible, in terms of globality and n-arity.

In some cases, a specialized Boolean resubstitution algorithm is tailored for maximum visibility. The algorithm works as follows. First order the LUTs to be processed based on maximum savings at each node. The maximum saving is the factored literal cost of the Maximum Fan-out-Free Cone (MFFC) of the node. Then process each LUT and find which other nodes are connectable, up to complementation, to realize the function of the target LUT via an OR operator. The function of the target LUT natively embeds MSPF flexibilities by construction, in order to find the largest set of connectable nodes. The MSPF and connectability computations are naturally performed with BDD operations, when BDDs can be built efficiently. SAT formulation and solving for the same computations is possible and preferable in the large scale scenario. In the small case scenario, say up to 15 inputs, truth tables can be used.

Once a set of connectable new fan-ins is found, a branch and bound algorithm is employed to determine the minimum irredundant (i.e., non-redundant) subset of new fan-ins that, once connected via an OR operator, with complementation as needed, can implement the original LUT functionality under MSPF. Note that such new solution may not always exist, in which case the minimum irredundant subset would be empty. The value k from the LUT mapping is useful to prune the search space of the branch and bound problem. Complete functionality may be checked during the branch and bound problem, so either BDD, SAT or truth table packages may be called. If a solution is found, the fan-in may be rearranged if that improves the solution, e.g., reduces number of factored literals. Once committing the resubstitution operation, and disconnecting the old fan-ins, it is important to refresh any global function data structure as MSPF information may need updating.

This Boolean resubstitution scales well for many small and medium size designs. For large designs, partitioning is a strategy to use this powerful resubstitution without incurring into intractable runtime. Also, several deterministic guards on runtime may be in place to bail out when computation becomes longer than the intended maximum budget for the resubstitution optimization. This makes LUT-enhanced Boolean resubstitution a powerful, yet runtime affordable, optimization technique.

C. Boolean Rewiring for LUTS

Boolean rewiring (330 in FIG. 3) is a synthesis technique that includes a sequence of additions and removals of redundant wires, with the goal of reducing the (factored) literal cost of the network. Inserting a new redundant wire to an irredundant circuit can make two or more wires to be redundant, under certain conditions, thus leading to new simplification opportunities. Inserting a new redundant wire means introducing a new gate, or swapping to a wider gate, capable of receiving the extra connection. ATPG engines are historically quite efficient to detect such redundancies. Boolean rewiring is classically a greedy technique, where single rewiring operations are immediately accepted when positive gain is observed. Zero gain moves are useful as well to escape local minima.

In the LUT optimization framework, Boolean rewiring is extended to operate on LUTs and introduce 2-input LUTs, i.e., AND/OR, for the new redundant wires.

D. LUT Optimization Flow for Asics

FIG. 3 depicts a flowchart for LUT optimization using the techniques described above, combined in an intelligent gradient-based engine. For the sake of brevity, this examples uses AIG as target output network type. However, mapped networks or primitive networks are a natural extension of this methodology. Primitive networks are logic networks decomposed into a set of primitive functions, such as NAND, NOR, INV, MUX, XNOR.

The LUT optimization engine (LUT-engine) is capable of reducing the implementation complexity in terms of NAND2/AIG count, with efficient runtime. Algorithm 2 depicts the pseudocode for FIG. 3. Note that some parameters related to mapping and to optimization methods are omitted for the sake of brevity.

This makes LUT optimization adaptive. This is achieved by using gradient computation of the NAND2/AIG count gain: It allows the system to decide dynamically the best next attempted transformation. The LUT engine algorithm starts by duplicating the current network. This is done in case the LUT engine degrades the NAND2/AIG cost and decides to revert at the end. Then, the system accesses a first valid k-LUT mapping of the network 250, before starting the iterative loops. The iterative loops are controlled by a budget E, which is consumed by running various LUT optimizations.

The LUT optimizations are applied in a waterfall model where different optimization techniques are applied sequentially according to an order. This leads to better runtime as compared to parallel model. In this example, the waterfall model is a good tradeoff between runtime and QoR. This example uses three main LUT optimization techniques 310, 320, 330 in the waterfall model. The first technique 310 is the cheapest in terms of runtime and includes LUT support reduction, simplification with don't cares and remapping. This least runtime expensive move is repeated until the gain exceeds the threshold T 312. This reduces the complexity of the LUTs in the network with low effort optimization, so the system continues with this approach until diminishing returns are reached. If the gain is less than the threshold T 312, the system considers additional LUT techniques with stronger optimization.

---

Algorithm 2 LUT Engine Optimization Flow

---

Input: AIG N, LUT size k, effort E, small gain thr. T
Output: Optimized AIG N.
 1:   N dup = N; /* for lossless synthesis */
 2:   lut_map(N, k); gain = 0;
 3:   while E > 0 do
 4:       update(gain);
 5:       if gain is flat for too many iterations then
 6:           break;
 7:       end if
 8:       if gain > T then
 9:           /* if gain > T, apply cheap optimization*/
10:           lut_reduction(N); simplify_dc(N);
11:           lut_map(N, k); reduce_budget(E);
12:           continue;
13:       end if
14:       det_randomize(N);
15:       /* apply stronger optimization 1 */
16:       lut_resub(N); lut_reduction(N);
17:       simplify_dc(N); lut_map(N, k);
18:       reduce_budget(E); update(gain);
19:       if gain > T then
20:           continue;
21:       end if
22:       /* apply stronger optimization 2 */
23:       lut_resub(N); Boolean_rewiring(N);
24:       simplify_dc(N); lut_map(N, k);
25:       reduce_budget(E); update(gain);
26:   end while
27:   Boolean_decomp(N);
28:   if N is better than N dup then
29:       return N;
30:   end if
31:   return N dup;

---

Before getting into the stronger moves, deterministic randomization 315 of the LUT network is applied. This includes shuffling fan-in/fan-out order of the nodes and picking different topological orderings. Randomizing the network may escape local minima.

In this example, the first higher effort LUT optimization technique includes Boolean resubstitution 320, in addition to LUT reduction, simplify with don't cares and LUT remapping. Here, Boolean resubstitution 320 is the main workhorse considerably reducing the network cost. The next higher effort LUT optimization technique includes Boolean rewiring 330, in addition to the prior techniques. Boolean rewiring is a powerful transform to escape local minima as it can add/remove wires, reduce literal cost and highlight new LUT compaction opportunities. In each case, the loop continues to iterate so long as the gain exceeds a threshold T 322, 332.

If the gain remains flat for too long during the loop, the LUT engine may automatically bail out to save runtime. At the end of the iterative loop, the network of LUTs is decomposed into AIGs via algebraic and Boolean decomposition, as described below. Finally, if the cost of the network is better than the initial cost, the change is accepted. Otherwise, it is rejected and the system reverts back to the original network.

III. Reducing LUTS to AIG and Mapped Networks

The last step (130 in FIG. 1) in LUT optimization for ASICs includes decomposing the LUTs into a factorized form and, in turn, decomposing the network into an AIG or a mapped network. To obtain a factorized form of the SOP of each node, the logic function is extracted from the LUT and decomposed into primitive gates. The decomposition is achieved by recursively applying kernel extraction. For each node f in the network, the recursive kernel decomposition works as follows. If a non-trivial divisor g is found, f is rewritten using divisor g as literal, and the algorithm is recursively applied on both f and g. If a divisor is not found, the procedure returns the LUT itself. The output of the algorithm is an array of all nodes involved in the factorized form off, which can be used to obtain an AIG or a mapped network. A final pass of light AIG-engine may help QoR.

IV. Experimental Results

Figure 4:
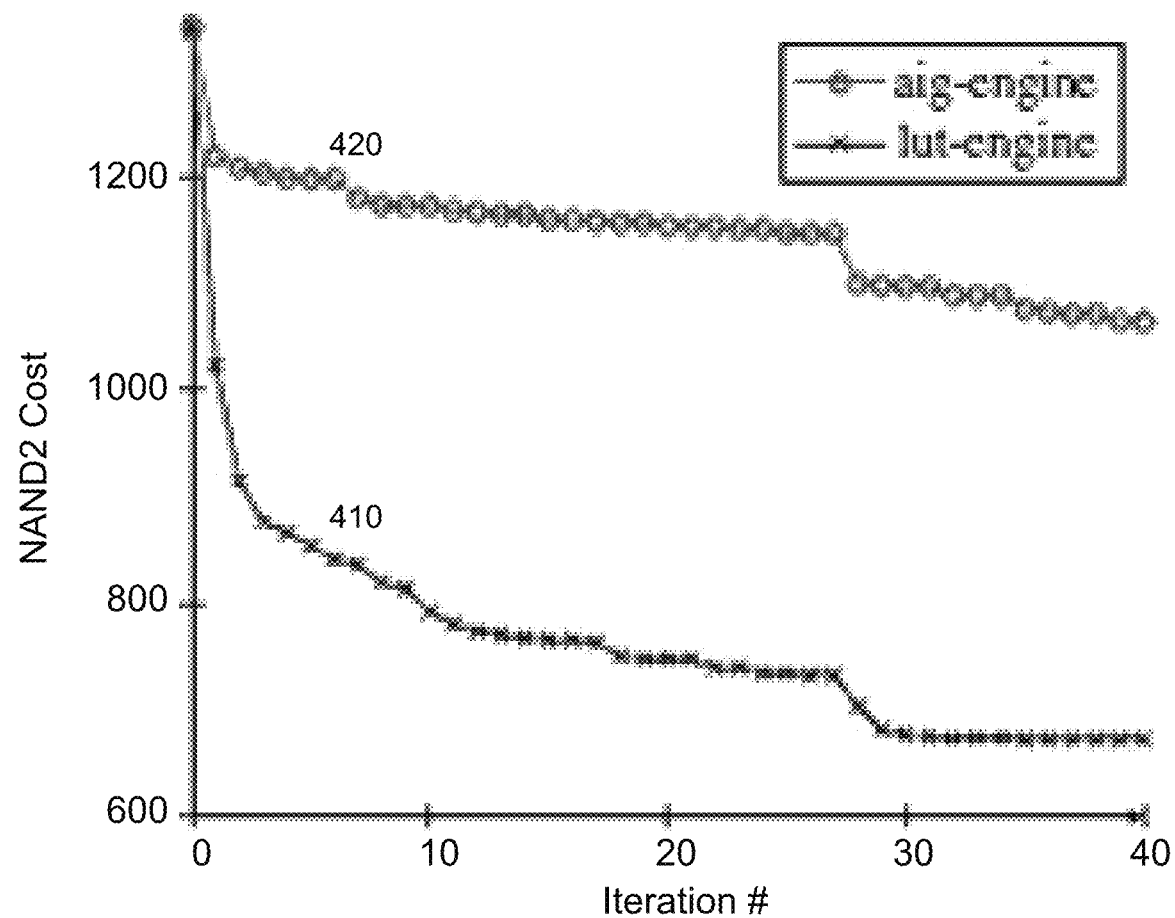
FIG. 4 depicts a comparison of LUT-engine and AIG-engine on i2c benchmark.

To study the effectiveness of the LUT-engine standalone, it is compared to a similar methodology but that only considers AIGs, referred to as AIG-engine. FIG. 4 shows the comparison of AIG-engine vs. LUT-engine for the i2c controller, which is a relevant benchmark within the EPFL suite. Curve 410 shows the NAND2 cost (i.e., estimated area) achieved by the LUT-engine after each iteration, and curve 420 shows the NAND2 cost achieved by the AIG-engine. The setup of AIG-engine is for fixed 40 iterations. The setup of LUT-engine is k=3, with T=1% and fixed 40 iterations. The i2c academic benchmark has good correlation with the trend observable in industrial designs. The NAND2 count for the AIG-engine goes from 1342 to 1065. There are good improvements that saturate with increasing iteration number. On the other hand, the LUT-engine is immediately able to get i2c NAND2 count down to mid 800s, thanks to cheap moves containing LUT-mapping and simplify-don't care. Even after that, the LUT-engine continues with steady gains and escapes from local minima. The saturation eventually arrives only around iteration 30, when the flat gain would trigger the bail out mechanism. The final NAND2 count for the LUT-engine is 673, which is the smallest AIG currently known for i2c benchmark.

LUT-engine was also run on other EPFL benchmarks. The results challenge the area (i.e., number of LUTs) category within the EPFL benchmark suite project that keeps track of the best 6-input LUT synthesis results. LUT-engine is used with max k=6.

The LUT-engine improved the previous best size (area) results for the 12 benchmark circuits reported in Table II. I/O is the number of inputs and outputs. LUT count is the number of 6-LUTs. Level count is the maximum number of LUTs between input and output. Even though the EPFL benchmarks have been optimized several times in the last five years, for some of the benchmarks, improvement is larger than 500 6-LUTs. Further, the LUT-engine obtained a new best result for the adder benchmark, that has not been improved since 2016.

TABLE II

NEW BEST AREA RESULTS FOR THE EPFL SUITE

| Benchmark | I/O | 6-input LUT count | Level Count. |
|---|---|---|---|
| adder | 256/129 | 191 | 184 |
| arbiter | 256/129 | 307 | 78 |
| divisor | 128/128 | 3250 | 1189 |
| hypotenuse | 256/128 | 39826 | 4492 |
| log2 | 32/32 | 6513 | 132 |
| mem_ctrl | 1204/1231 | 2019 | 21 |
| mult | 128/128 | 4898 | 93 |
| priority | 128/8 | 101 | 26 |
| sin | 24/25 | 1205 | 61 |
| sqrt | 128/64 | 3030 | 1093 |
| square | 64/128 | 3232 | 76 |
| voter | 1001/1 | 1281 | 19 |

LUT-engine was also applied to 36 industrial ASIC benchmarks. To show the efficacy of LUT-engine, the average results are presented with respect to a baseline flow without LUT-engine. The results, post place and route, are summarized in Table III. All benchmarks are verified to be equivalent with an industrial formal equivalence checking flow.

TABLE III

POST PLACE & ROUTE RESULTS ON 36 INDUSTRIAL DESIGN

| Flow | Area | Sw. Power | WNS | TNS | Runtime |
|---|---|---|---|---|---|
| Baseline | 1 | 1 | 1 | 1 | 1 |
| LUT engine | −1.80% | −1.72% | −0.42% | −0.39% | +5% |

The design flow, embedding the LUT-engine, achieves sensible combinational area and combinational switching power reductions, 1.80% and 1.72% respectively, on average, and also good improvements in worst negative slack (WNS) and total negative slack (TNS), with moderate 5% runtime cost.

Back to back calls of LUT-engine with max k=3, 4, 5 can help QoR further at expenses of runtime: size 4 and 5 can compact more advantageously the logic for some designs. Nevertheless, max k=3 generally remains the most effective LUT size for LUT-engine as it includes the most common primitive gates (NAND2, NOR2, XNOR2, MUX21, MAJ31) but also more complex functionalities, such as AOI (AND-OR-Inverter), that are quite efficient in modern standard cells libraries.

V. EDA Flow

Figure 5:
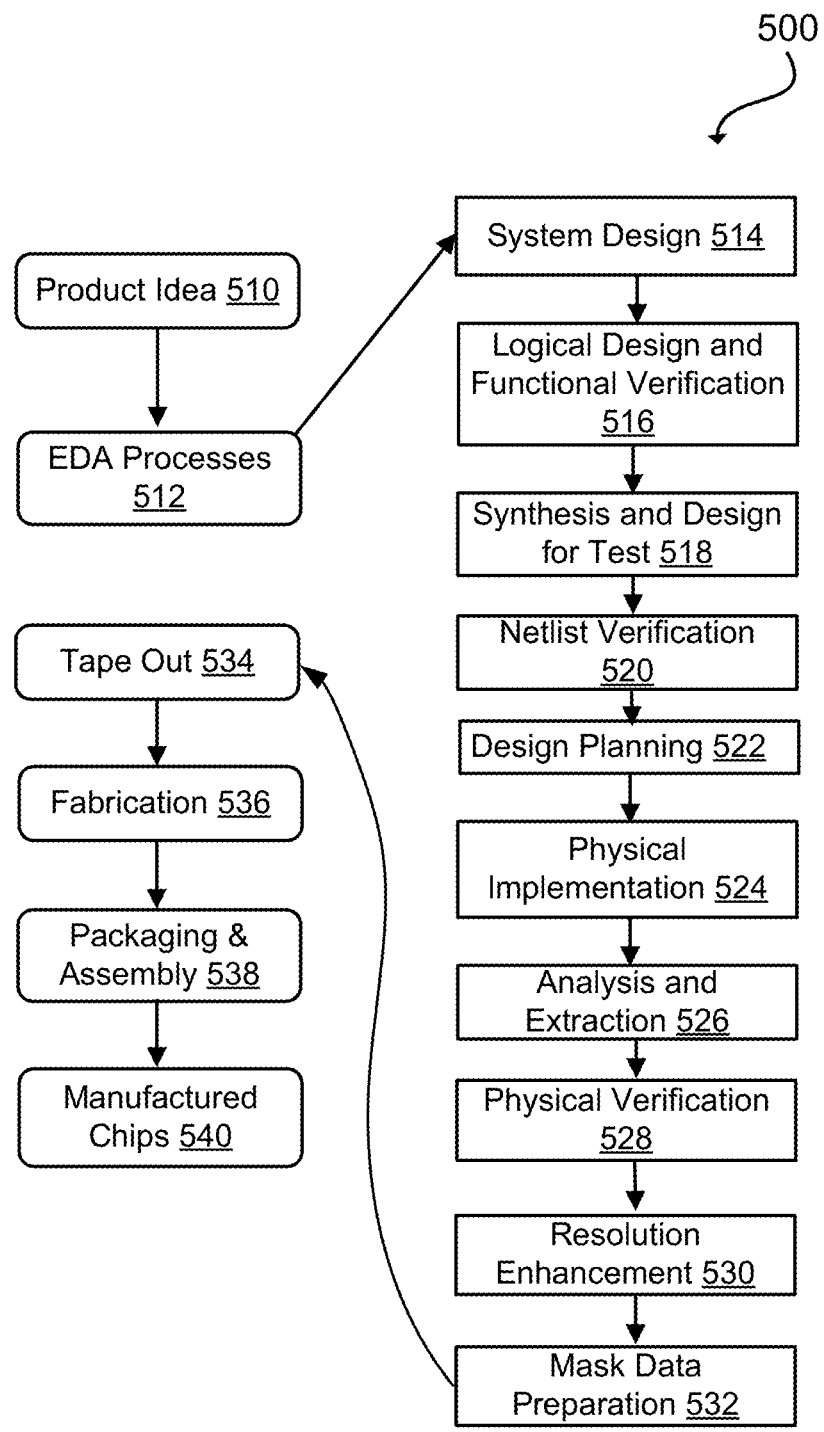
FIG. 5 depicts a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 5. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
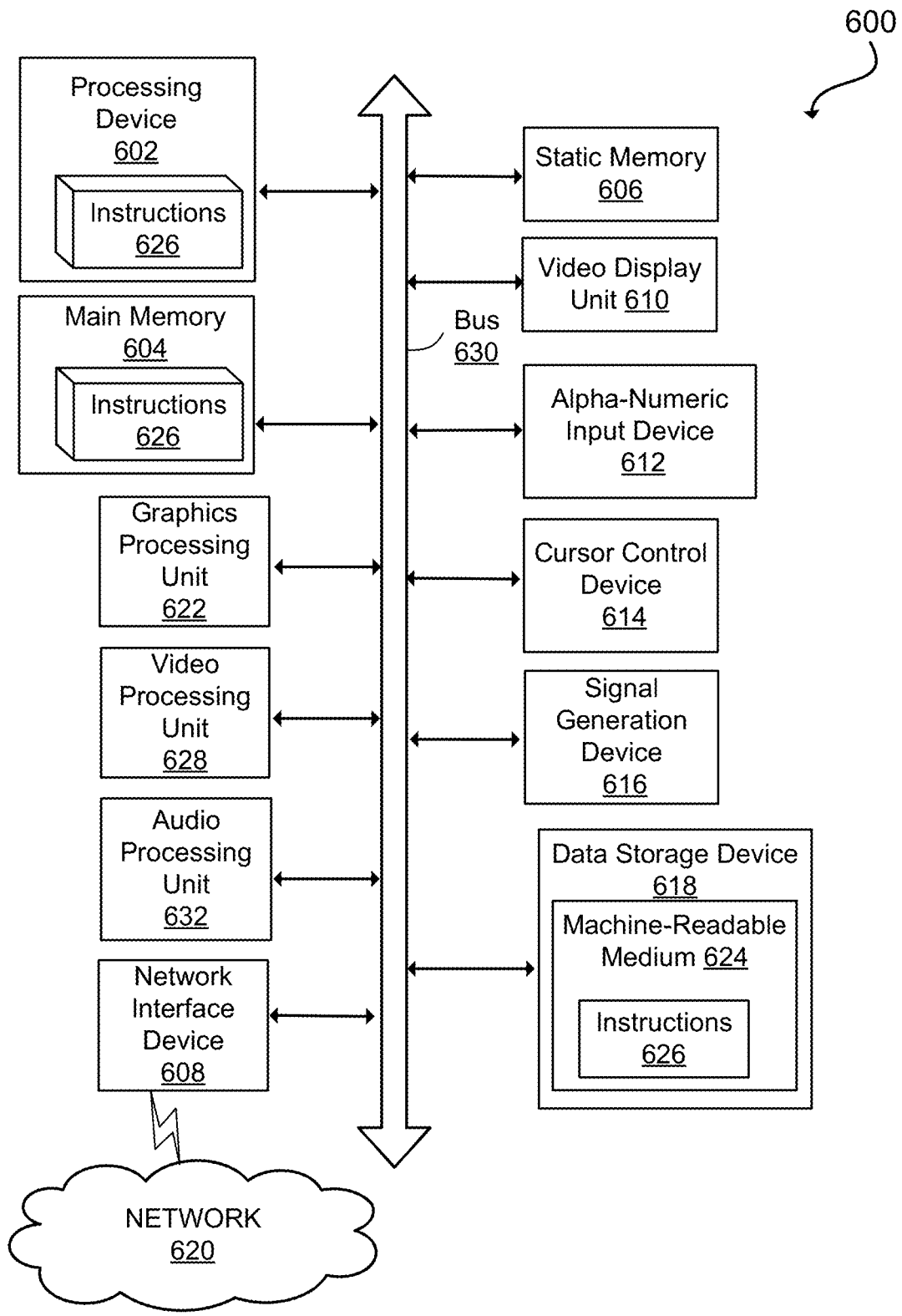
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   accessing a description of an application-specific integrated circuit (ASIC), the description comprising a logic network that implements a functionality of the ASIC;
   mapping, by a processor, the logic network to a network of lookup tables (LUTs), wherein a LUT with k inputs can represent any function on k variables and the mapping is based at least in part on estimated areas of the LUTs; and
   reducing the network of LUTs to a gate-level netlist of standard cells.

2. The method of claim 1 wherein the network of LUTs consists of LUTs all of which have not more than a predefined number of inputs.

3. The method of claim 2 wherein mapping the logic network to a network of LUTs comprises:
   formulating the mapping as a binate covering problem and solving the binate covering problem.

4. The method of claim 3 wherein the binate covering problem is solved by a branch and bound approach.

5. The method of claim 1 wherein, for all k less than a defined threshold: the estimated area of all LUTs with k inputs is the same and is based on a multiplier times the estimated area of all LUTs with j inputs, with j<k.

6. The method of claim 5 wherein the estimated area of all LUTs with 3 inputs is a multiplier times the estimated area of all LUTs with 2 inputs.

7. The method of claim 1 wherein, for all k greater than a defined threshold: the estimated area of all LUTs with k inputs is based on a cone of logic for the LUT.

8. A non-transitory computer readable medium comprising stored instructions, which when executed by a processor, cause the processor to perform operations comprising:
   accessing a description of an application-specific integrated circuit (ASIC), the description comprising a network of lookup tables (LUTs) that implements a functionality of the ASIC; and
   reducing an area of the LUTs in the network of LUTs.

9. The non-transitory computer readable medium of claim 8 wherein reducing the area of the LUTs in the network comprises:
   applying a Boolean optimization to LUTs in the network.

10. The non-transitory computer readable medium of claim 8 wherein reducing the area of the LUTs in the network comprises:
    applying a Sum Of Products (SOP) minimization using don't cares to LUTs in the network.

11. The non-transitory computer readable medium of claim 8 wherein reducing the area of the LUTs in the network comprises:
    reducing support sizes of LUTs in the network.

12. The non-transitory computer readable medium of claim 8 wherein reducing the area of the LUTs in the network comprises:
    applying Boolean resubstitution to LUTs in the network.

13. The non-transitory computer readable medium of claim 12 wherein the Boolean resubstitution is implemented using a branch and bound approach.

14. The non-transitory computer readable medium of claim 8 wherein reducing the area of the LUTs in the network comprises:
    applying Boolean rewiring to LUTs in the network.

15. A system comprising:
    a memory storing instructions; and
    a processor, coupled with the memory and to execute the instructions, the instructions when executed cause the processor to perform operations comprising:
    mapping, by a processor, a logic network that implements a functionality of an application-specific integrated circuit (ASIC), to a network of lookup tables (LUTs), wherein the mapping is based at least in part on estimated areas of the LUTs; and
    applying a number of different Boolean optimization techniques to reduce an area of the LUTs in the network of LUTs.

16. The system of claim 15 wherein applying the different Boolean optimization techniques comprises:
    applying the different Boolean optimization techniques in a sequential order of increasing runtime.

17. The system of claim 15 wherein the different Boolean optimization techniques are categorized into at least three different levels of techniques, and applying the different Boolean optimization techniques comprises applying the Boolean optimization techniques in order according to their levels.

18. The system of claim 17 wherein a second or later level includes Boolean resubstitution, and a level after Boolean resubstitution include Boolean rewiring.

19. The system of claim 17 wherein applying the different Boolean optimization techniques comprises:
   determining when a gain from applying a current level of techniques falls below a threshold; and
   in response to said determination, applying a later level of techniques.

20. The system of claim 17 wherein later levels include all of the techniques applied in earlier levels.

* * * * *